US008093895B2

(12) United States Patent
Umeda

(10) Patent No.: US 8,093,895 B2
(45) Date of Patent: Jan. 10, 2012

(54) MAGNETIC RESONANCE IMAGING APPARATUS AND MAGNETIC RESONANCE IMAGING METHOD OF CONTROLLING IMAGE CONTRAST

(75) Inventor: Masaaki Umeda, Tochigi-Ken (JP)

(73) Assignees: Kabushiki Kaisha Toshiba, Tokyo (JP); Toshiba Medical Systems Corporation, Tochigi-Ken (JP)

( * ) Notice: Subject to any disclaimer, the term of this patent is extended or adjusted under 35 U.S.C. 154(b) by 315 days.

(21) Appl. No.: 12/427,337

(22) Filed: Apr. 21, 2009

(65) Prior Publication Data

US 2009/0267604 A1 Oct. 29, 2009

(30) Foreign Application Priority Data

Apr. 25, 2008 (JP) .................................. 2008-115398
Mar. 9, 2009 (JP) .................................. 2009-054482

(51) Int. Cl.
*G01V 3/00* (2006.01)
(52) U.S. Cl. ....................................................... 324/307
(58) Field of Classification Search .......... 324/300–322; 600/410–435
See application file for complete search history.

(56) References Cited

U.S. PATENT DOCUMENTS

| 5,281,917 | A | * | 1/1994 | Santyr ............................. 324/309 |
| 5,879,299 | A | | 3/1999 | Posse et al. |
| 6,144,201 | A | * | 11/2000 | Miyazaki ....................... 324/306 |
| 6,583,623 | B1 | | 6/2003 | Kwok et al. |
| 7,254,437 | B2 | * | 8/2007 | Miyazaki ...................... 600/410 |
| 2008/0238422 | A1 | | 10/2008 | Yui |

FOREIGN PATENT DOCUMENTS

| EP | 1975638 A2 | 10/2008 |
| EP | 1975638 A3 | 3/2009 |
| WO | 2007/124244 A | 11/2007 |

OTHER PUBLICATIONS

Jeong E-K et al: "High-resolution DTI of a localized volume using 3D single-shot diffusion-weighted stimulated echo-planar imaging (3D ss-DWSTEPI)", Magnetic Resonance in Medicine, Academic Press, Duluth, MN, US, vol. 56, No. 6, Dec. 1, 2006, pp. 1173-1181, XP007909264 ISSN: 0740-3194 * p. 1174-p. 1176; figures 1,3,4.
Franconi F et al: "Chemical Shift Imaging From Simultaneous Acquisition of a Primary and a Stimulated Echo", Magnetic Resonance in Medicine, Academic Press, Duluth, MN, US, vol. 33, No. 5, May 1, 1995, pp. 683-688, XP000620371, ISSN: 0740-3194 * p. 684-p. 685, col. 1; figure 1b.*

(Continued)

*Primary Examiner* — Dixomara Vargas
(74) *Attorney, Agent, or Firm* — Knoble Yoshida & Dunleavy, LLC

(57) ABSTRACT

A magnetic resonance imaging apparatus includes a data acquisition unit and an image data generating unit. The data acquisition unit acquires MR signals for imaging by an imaging scan with a frequency-selective or slice-selective radio frequency intermediate pulse for controlling a contrast and a spoiler gradient magnetic field for suppressing unnecessary signal component after applying al least one of radio frequency excitation pulses. The image data generating unit generates image data based on the magnetic resonance signals.

15 Claims, 6 Drawing Sheets

OTHER PUBLICATIONS

Lin W et al: "Intracranial MR Angiography: Application of Magnetization Transfer Contrast and Fat Saturation to Short Gradient-Echo, Velocity-Compensated Sequences", Radiology, Oak Brook,IL, vol. 186, No. 3, Jan. 1, 1993, pp. 753-761, XP008025957 ISSN: 0033-8419, *p. 753-p. 755; figure 1. *

Hardy P A et al: "Fat Suppressed MRI of Articular Cartilage With a Spatial-Spectral Excitation Pulse", Journal of Magnetic Resonance Imaging, Society for Magnetic Resonance Imaging, Oak Brook, IL, US, vol. 8,No. 6, Nov. 1, 1998, pp. 1279-1287, XP008040958 ISSN: 1053-1807, *the whole document*.

Schick F: "Pulsed Magnetization Transfer Contrast MRI by a Sequence With Water Selective Excitation", Journal of Computer Assisted Tomography, NfwYork, NY, US, vol. 20, No. 1, Jan. 1, 1996, pp. 73-79, XP008016622*, the whole document. *

Schick F et al: "Highly Selective Water and Fat Imaging Applying Multislice Sequences Without Sensitivity to B1 Field Inhomogeneities", Magnetic Resonance in Medicine, Academic Press, Duluth, MN, US, vol. 38, No. 2, Aug. 1, 1997, pp. 269-274, XP000695507, ISSN: 0740-3194, *the whole document*.

EP Extended Search Report dated Aug. 6, 2009 for corresponding EP Application No. 0900564.6.

* cited by examiner

MAGNETIC RESONANCE IMAGING APPARATUS AND MAGNETIC RESONANCE IMAGING METHOD OF CONTROLLING IMAGE CONTRAST

BACKGROUND OF THE INVENTION

1. Field of the Invention

The present invention relates to a MRI (magnetic resonance imaging) apparatus and a magnetic resonance imaging method which excite nuclear spin of an object magnetically with a RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which perform imaging with applying a desired RF pulse, such as a fat saturation pulse, for controlling an image contrast.

2. Description of the Related Art

Magnetic Resonance Imaging is an imaging method which excites nuclear spin of an object set in a static magnetic field with a RF signal having the Larmor frequency magnetically and reconstruct an image based on NMR signals generated due to the excitation.

In the field of magnetic resonance imaging, the techniques to control an image contrast include the fat suppression methods. The fat suppression methods that has been widely used in general include the CHESS (chemical shift selective) method, the SPIR (spectral presaturation with inversion recovery) method (also referred as SPECIR method), and the STIR (short TI inversion recovery) method.

Of the fat suppression methods, the CHESS method is referred as a frequency-selective fat suppression method since the method suppresses only fat signals frequency-selectively using the fact that the resonance frequencies of the water proton and the fat proton mutually differs by 3.5 ppm (see, for example, Japanese Patent Application (Laid-Open disclosure) No. 7-327960, Japanese Patent Application (Laid-Open disclosure) No. 9-182729 and Japanese Patent Application (Laid-Open disclosure) No. 11-299753). A CHESS pulse is applied as a RF pre-pulse in advance of data acquisition for imaging in the CHESS method.

The SPIR method is also a frequency-selective fat suppression method which uses the difference in the resonance frequency between the water proton and the fat proton (see, for example, Japanese Patent Application (Laid-Open disclosure) No. 2006-149583). In the SPIR method, a SPIR pulse that is a frequency-selective inversion RF pulse matched with a resonance frequency of fat signals is applied as a RF pre-pulse.

Meanwhile, the STIR method is a fat suppression method which uses a difference in T1 relaxation time between a fat signal and a water signal and a frequency-nonselective fat suppression method.

FIG. 1 is a time chart of the conventional pulse sequence under the FSE (fast spin echo) method with applying a frequency-selective fat saturation pulse as a RF pre-pulse.

In FIG. 1, RF denotes RF pulses, Gss, Gro and Gpe denote axes to which gradient magnetic field for slice selection, gradient magnetic field for RO (readout) and gradient magnetic field for PE (phase encode) are applied respectively, ECHO denotes echo signals.

As shown in FIG. 1, an α° frequency-selective fat saturatio pulse RFc1 for suppressing unnecessary signals from fat is applied as a RF pre-pulse prior to a FSE sequence for imaging. In addition, a spoiler gradient magnetic field Gsp1 is applied in a gradient magnetic field direction for slice selection subsequently to the α° frequency-selective fat saturation pulse RFc1.

In the FSE sequence, a flip pulse RFI1 with 90 degrees of FA (flip angle) is generally applied as a RF excitation pulse. In addition, plural refocus pulses RFI2, RFI3, RFI4, . . . are applied at an ETS (Echo Train Space) subsequently to the flip pulse RFI1. Each FA of the refocus pulses RFI2, RFI3, RFI4, . . . is generally set to 180 degrees. An interval between the flip pulse RFI1 and the first refocus pulse RFI2 is set to ETS/2.

Meanwhile, a slice selection gradient magnetic field pulse Gss1 corresponding to the flip pulse RFI1, and slice selection gradient magnetic field pulses Gss2, Gss3, Gss4, . . . corresponding to the refocus pulses RFI2, RFI3, RFI4, . . . , respectively are applied. The slice selection gradient magnetic field pulse Gss1 corresponding to the flip pulse RFI1 has a dephasing part. Each of the slice selection gradient magnetic field pulses Gss2, Gss3, Gss4, . . . corresponding to the refocus pulses RFI2, RFI3, RFI4, . . . , respectively has spoiler gradient magnetic field parts on its both sides.

Further, readout gradient magnetic field pulses Gro2, Gro3, ... each having a same area S are applied following the refocus pulses RFI2, RFI3, RFI4, ..., respectively. In addition, a readout gradient magnetic field pulse Gro1 for dephasing is applied following the flip pulse RFI1. The area of the readout gradient magnetic field pulse Gro1 for dephasing is set to be S/2 which is half of each area S of the readout gradient magnetic field pulses Gro2, Gro3, ... applied subsequent to the refocus pulses RFI2, RFI3, RFI4, . . . .

Moreover, phase encode gradient magnetic field pulses Gpe1, Gpe2, Gpe3, Gpe4, . . . having reversed signs and equal areas are applied in intervals between respective applications of the refocus pulses RFI2, RFI3, RFI4, . . . .

In the foregoing pulse sequence, echo signals Echo1, Echo2, . . . are generated by application of the readout gradient magnetic field pulses Gro2, Gro3, . . . .

In recent years, the high magnetization technique in the MRI apparatus has been investigated and a high magnetic field apparatus have been produced. However, especially under a high magnetic field not less than 3T, it is known that there is a B1 inhomogeneity problem that an inhomogeneity in a RF magnetic field increases due to attenuation of a RF pulse since a RF pulse having a shorter wavelength attenuates more in a living body while a resonance frequency becomes higher. The B1 inhomogeneity is also referred as RF magnetic field inhomogeneity.

Consequently, an adequate fat suppression effect might not be achieved by simply applying a frequency-selective fat saturation pulse, such as a CHESS pulse, as a RF pre-pulse, depending on an imaging condition as in the case of being under a high magnetic field.

This problem is common to an imaging with application of a RF pulse for controlling an image contrast, as well as a fat saturation pulse. That is, a desired image contrast could not be obtained simply by applying a RF pre-pulse for controlling an image contrast.

On the other hand, an imaging with application of a RF pre-pulse has a problem with increasing an imaging time. Especially in multi-slice imaging, the problem is that the minimum TR (repetition time) is increased by application of a RF pre-pulse and to increase the number of slices becomes difficult. Note that, the minimum TR is a TR for imaging a specific slice set consisting of multiple slices.

SUMMARY OF THE INVENTION

The present invention has been made in light of the conventional situations, and it is an object of the present invention to provide a magnetic resonance imaging apparatus and a magnetic resonance imaging method which make it possible to control an image contrast satisfactorily by applying an RF pulse for a desired purpose such as fat suppression with a shorter imaging period.

The present invention provides a magnetic resonance imaging apparatus comprising: a data acquisition unit configured to acquire magnetic resonance signals for imaging by an imaging scan with applying a frequency-selective or slice-selective radio frequency intermediate pulse for controlling a contrast and a spoiler gradient magnetic field for suppressing unnecessary signal component after applying al least one radio frequency excitation pulse to be applied for acquiring the magnetic resonance signals, the spoiler gradient magnetic field being subsequent to the radio frequency intermediate pulse; and an image data generating unit configured to generate image data based on the magnetic resonance signals, in an aspect to achieve the object.

The present invention also provides a magnetic resonance imaging apparatus comprising: a data acquisition unit configured to acquire magnetic resonance signals for imaging by an imaging scan with applying a frequency-selective or slice-selective fat saturation pulse for controlling a contrast and a spoiler gradient magnetic field for suppressing unnecessary signal component after applying al least one of radio frequency excitation pulses to be applied for acquiring the magnetic resonance signals, the spoiler gradient magnetic field being subsequent to the fat saturation pulse; and an image data generating unit configured to generate image data based on the magnetic resonance signals, in an aspect to achieve the object.

The present invention also provides a magnetic resonance imaging method comprising: acquiring magnetic resonance signals for imaging by an imaging scan with applying a frequency-selective or slice-selective radio frequency intermediate pulse for controlling a contrast and a spoiler gradient magnetic field for suppressing unnecessary signal component after applying al least one of radio frequency excitation pulses to be applied for acquiring the magnetic resonance signals, the spoiler gradient magnetic field being subsequent to the radio frequency intermediate pulse; and generating image data based on the magnetic resonance signals, in an aspect to achieve the object.

The magnetic resonance imaging apparatus and the magnetic resonance imaging method according to the present invention as described above make it possible to control an image contrast satisfactorily by applying an RF pulse for a desired purpose such as fat suppression with a shorter imaging period.

DESCRIPTION OF THE PREFERRED EMBODIMENTS

A magnetic resonance imaging apparatus and a magnetic resonance imaging method according to embodiments of the present invention will be described with reference to the accompanying drawings.

(Configuration and Function)

Figure 1:
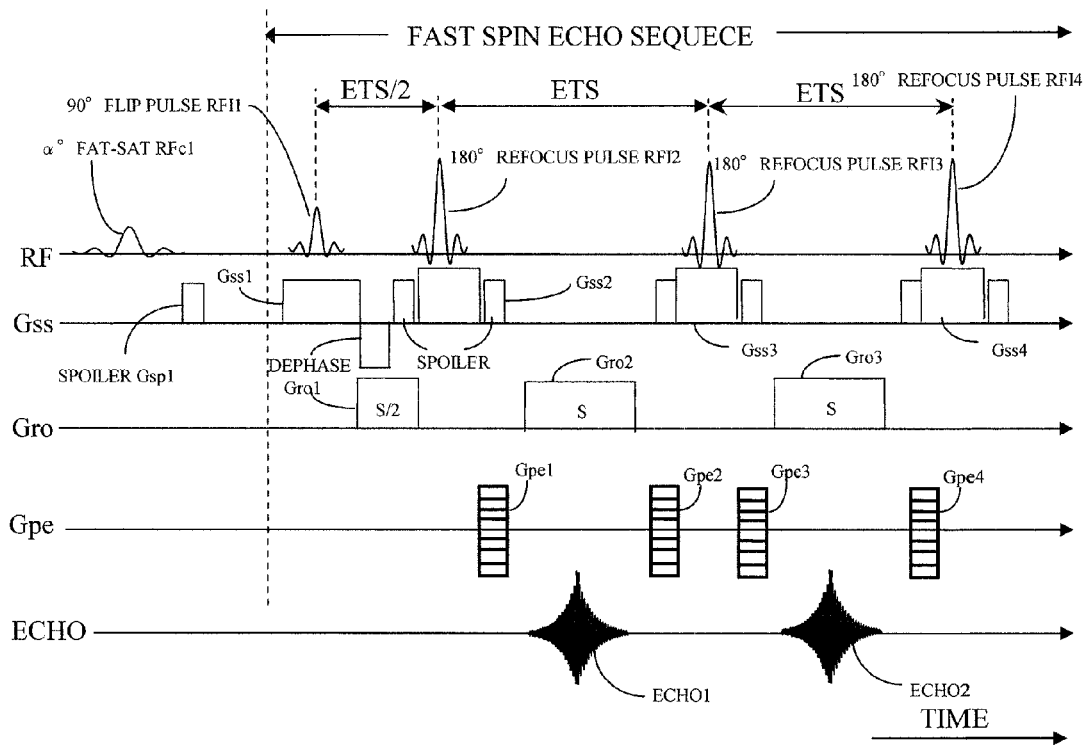
FIG. 1 is a time chart of the conventional pulse sequence under the FSE (fast spin echo) method with applying a frequency-selective fat saturation pulse as a RF pre-pulse.
Figure 2:
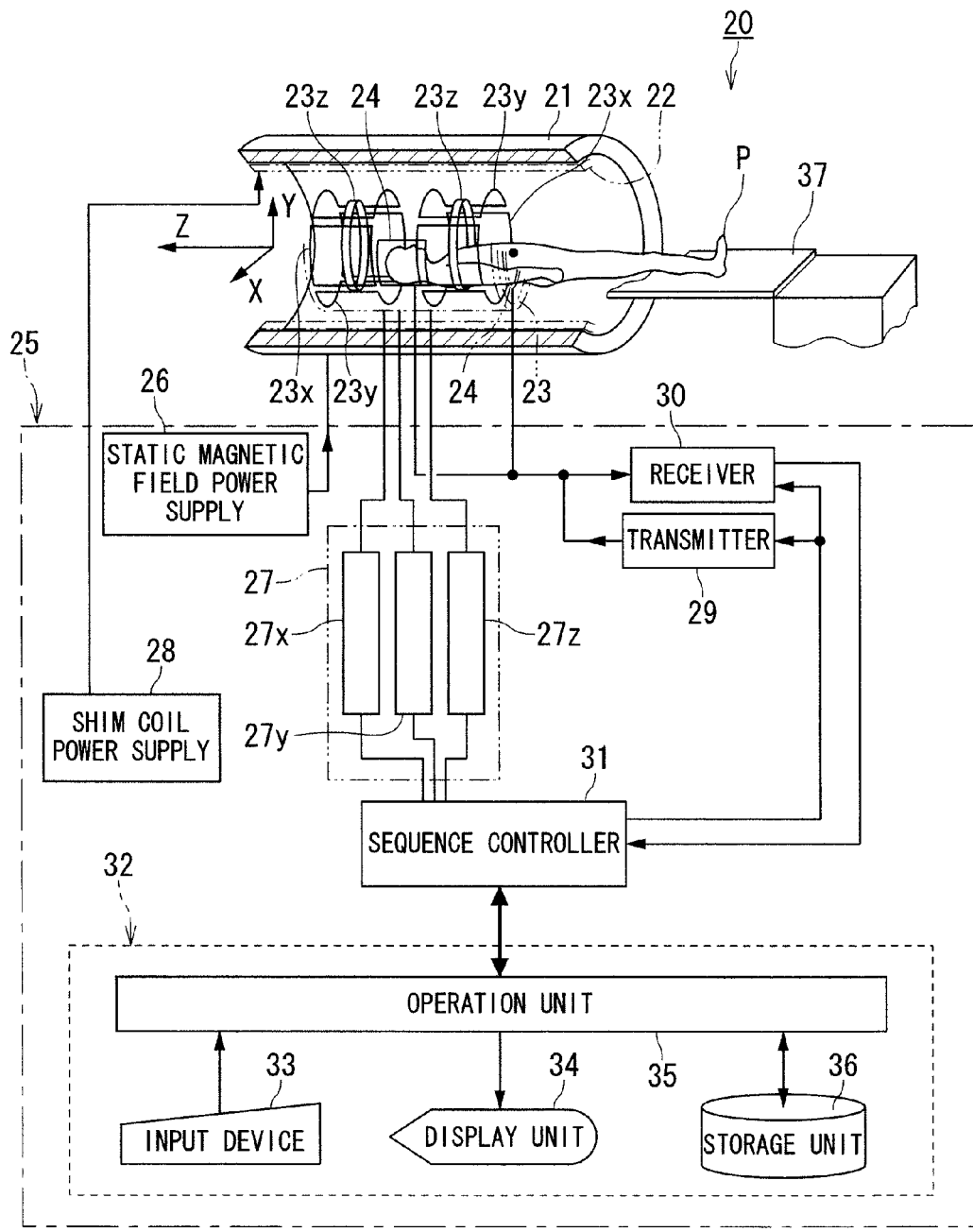
FIG. 2 is a block diagram showing a magnetic resonance imaging apparatus according to an embodiment of the present invention.

FIG. 2 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 has a function to transmit a RF signal given from the transmitter 29 to the object P. The reception RF coil 24 has a function to receive a MR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to store sequence information describing control information needed in order to make the gradient power supply 27, the transmitter 29 and the receiver 30 generate gradient magnetic fields Gx, Gy and Gz in the X, Y and Z directions and a RF signal by driving the gradient power supply 27, the transmitter 29 and the receiver 30 according to a predetermined stored sequence. The above-described control information includes motion control information such as intensity, impression period and impression timing of the pulse electric current which should be impressed to the gradient power supply 27.

The sequence controller 31 is also configured to give raw data to the computer 32. The raw data is complex data obtained through the detection of a NMR signal and A/D conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a MR signal given from the RF coil 24 and performing predetermined signal processing and A/D converting to the detected MR signal. The receiver 30 also has a function to give the generated raw data to the sequence controller 31.

The computer 32 performs various functions in the operation unit 35 by executing some programs stored in the storage unit 36 of the computer 32. Alternatively, some specific circuits having various functions may be provided with the magnetic resonance imaging apparatus 20 instead of using some of the software programs.

Figure 3:
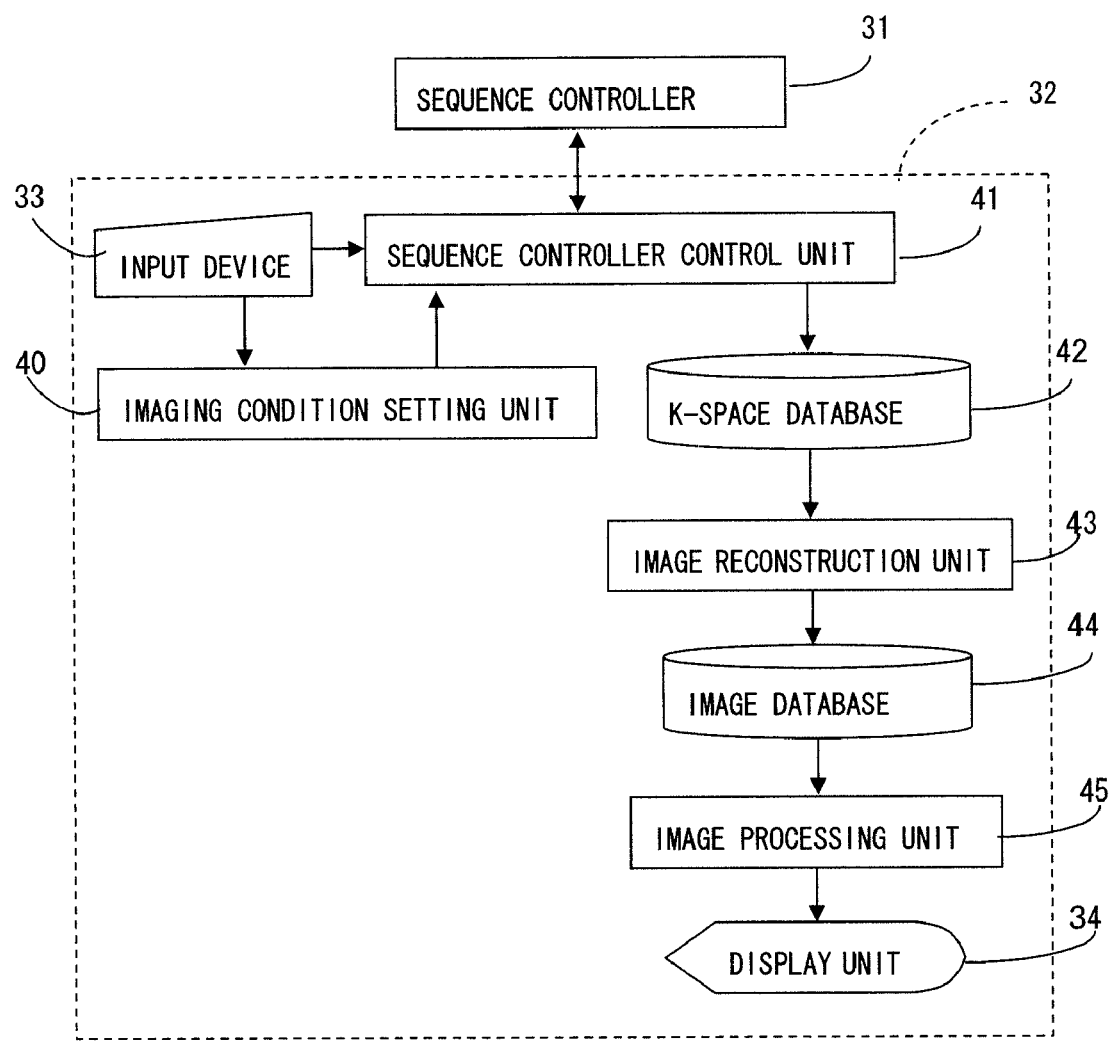
FIG. 3 is a functional block diagram of the computer shown in FIG. 2.

FIG. 3 is a functional block diagram of the computer 32 shown in FIG. 2. The computer 32 functions as an imaging condition setting unit 40, a sequence controller control unit 41, a k-space database 42, an image reconstruction unit 43, an image database 44 and an image processing unit 45 by executing certain software programs.

The imaging condition setting unit 40 has a function to set a pulse sequence with applying a frequency-selective or slice-selective RF pulse such as a fat-saturation pulse for controlling an image contrast and an imaging condition based on instruction from the input device 33, and to provide the set imaging condition to the sequence controller control unit 41. The RF pulse for controlling an image contrast is set as a RF intermediate pulse at least in an imaging sequence for acquiring NMR signals for imaging. Specifically, an application timing of a RF intermediate pulse for controlling an image contrast is set after at an earliest application of a RF excitation pulse for acquiring imaging data.

For example, when a timing for applying a RF intermediate pulse is before a timing for acquiring data on the center of the K space determined according to a TE (echo time) and an ETS, a more satisfactory contrast control can be performed by providing the effect of the RF intermediate pulse with the data, having the most effect on an image contrast, on the center of the K space. Therefore, a RF intermediate pulse can be applied multiple times at both timings before acquisition of all imaging data and before acquisition of the data on the center of the K space. However, the application of a RF intermediate pulse only at the timing before acquisition of the data on the center of the K space leads to shortening an imaging time.

Moreover, when it is preferable to control an image contrast more satisfactorily or intricately, for example, a frequency-selective or slice-selective RF pre-pulse for controlling an image contrast can be applied prior to an imaging sequence, i.e., before application of a RF excitation pulse for acquiring imaging data, as needed. On the contrary, when there is a need for shortening an imaging time, an imaging condition in which a RF intermediate pulse is applied without applying a RF pre-pulse may be set.

In addition, the pulse sequence is set so that a spoiler gradient magnetic field pulse for suppressing transverse magnetization signal component from an unnecessary metabolite such as fat is applied after each application of a RF intermediate pulse and a RF pre-pulse.

A RF contrast control pulse applied as a RF intermediate pulse or a RF pre-pulse can be an arbitrary pulse as long as it is either a slice-selective pulse as applied in a slice that is different from an imaging slice or a frequency-selective pulse as applied to a matter having a resonance frequency that is different from that of NMR signals acquired for imaging. Therefore, examples of a RF contrast control pulse include a water-selective excitation pulse, a fat saturation pulse, a saturation pulse, a spin labeling pulse, a MTC (magnetization transfer contrast) pulse and a SORS (slice-selective off-resonance sinc) pulse. Therefore, examples of a RF contrast control pulse include a water-selective excitation pulse, a fat saturation pulse, a saturation pulse, a spin labeling pulse, a MTC (magnetization transfer contrast) pulse and a SORS (slice-selective off-resonance sinc pulse).

The water-selective excitation pulse is a RF contrast control pulse for selectively exciting water, and the fat saturation pulse is a RF contrast control pulse for suppressing signals from fat. The saturation pulse is a RF contrast control pulse for saturating spins in a desired matter to suppress signals from the desired matter and is applied before application of a dephasing gradient magnetic field. The spin labeling pulse is a RF contrast control pulse for tagging a moving object flowing into an imaging section. The MTC pulse is a RF contrast control pulse for saturating magnetization of protons in bound water to suppress signals from parenchyma organs. The MTC pulse applied together with a slice selection gradient magnetic field is referred as the SORS.

A RF intermediate pulse and a RF pre-pulse can be RF contrast control pulses of the same kind and alternatively RF contrast control pulses of mutually different kinds. When a RF intermediate pulse and a RF pre-pulse are the same type of RF contrast control pulses, a contrast control can be performed more satisfactorily without increasing an imaging time. On the contrary, when a RF intermediate pulse and a RF pre-pulse are mutually different types of RF contrast control pulses, several types of contrast controls can be performed without increasing an imaging time.

In addition, an imaging condition can be set so that multiple RF intermediate pulses and/or multiple RF pre-pulses are applied. Even in those cases, multiple RF intermediate pulses can be set to the same type or different types of RF contrast control pulses. Similarly, multiple RF pre-pulses can be set to the same type or different types of RF contrast control pulses.

Note that, a fat saturation pulse is considered to be in the largest demands as a RF contrast control pulse. Therefore, an example of applying two fat saturation pulses as a single RF pre-pulse and a single RF intermediate pulse is described hereinafter. However, the same holds true for applying another RF contrast control pulse as a single RF pre-pulse, one of multiple RF pre-pulses, a single RF intermediate pulse or one of multiple RF intermediate pulses.

Figure 4:
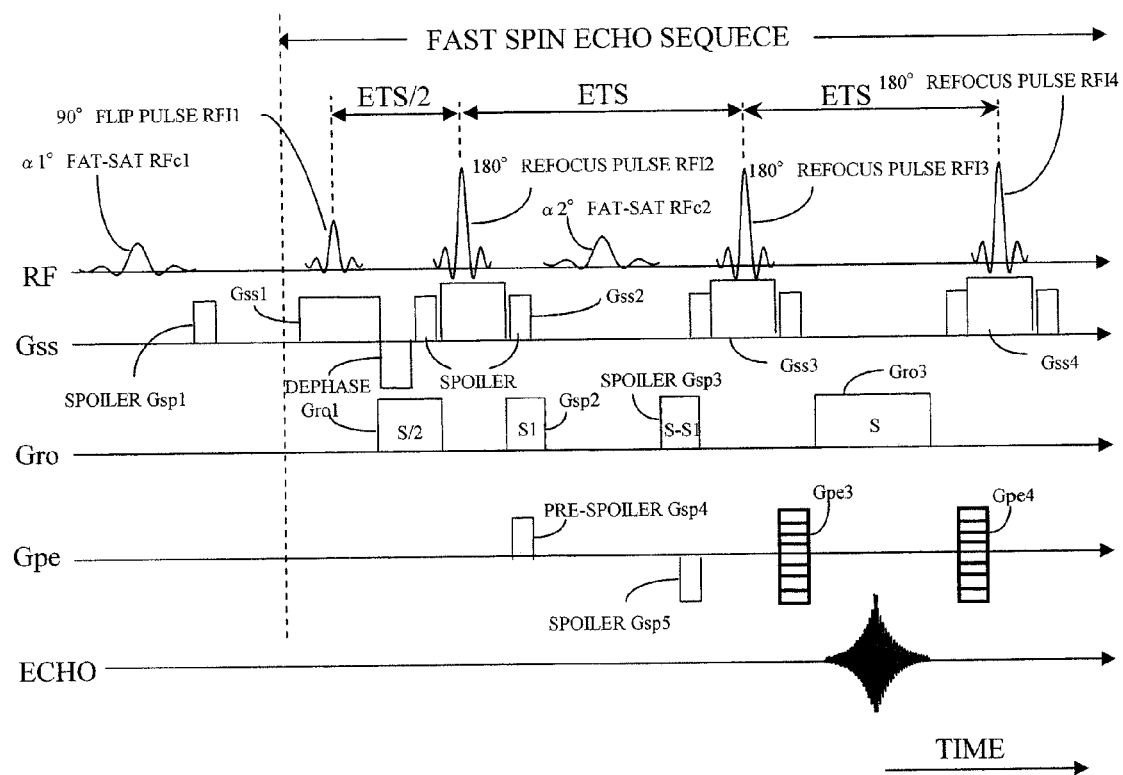
FIG. 4 is a time chart showing an example of FSE sequence, with applying two fat-saturation pulses as a RF pre-pulse and a RF intermediate pulse, which is set by the imaging condition setting unit shown in FIG. 3.

FIG. 4 is a time chart showing an example of FSE sequence, with applying two fat-saturation pulses as a RF pre-pulse and a RF intermediate pulse, which is set by the imaging condition setting unit 40 shown in FIG. 3.

In FIG. 4, RF denotes RF pulses while Gss, Gro and Gpe denote axes to which gradient magnetic field for slice selection, gradient magnetic field for readout and gradient magnetic field for phase encode are respectively applied. ECHO denotes echo signals.

As shown in FIG. 4, an $\alpha 1°$ frequency-selective (chemical shift selective) fat saturation pulse RFc1 for suppressing unnecessary signals from fat is applied as a RF pre-pulse prior to a FSE sequence for imaging. Further, a spoiler gradient magnetic field Gsp1 is applied in a slice selection gradient magnetic field direction, following the $\alpha 1°$ frequency-selective fat saturation pulse RFc1. The FA of the fat saturation pulse RFc1 is set to about $\alpha 1°=90°$ to $130°$ according to a required fat suppression effect.

In the FSE sequence, a flip pulse RFI1 with a 90 degrees of FA is generally applied as a RF excitation pulse. Further, multiple refocus pulses RFI2, RFI3, RFI4, . . . are applied at an ETS, following the flip pulse RFI1. The FA of the refocus pulses RFI2, RFI3, RFI4, . . . is generally set to 180 degrees. An interval between the flip pulse RFI1 and the first refocus pulse RFI2 is set to ETS/2.

Moreover, an $\alpha 2°$ frequency-selective fat saturation pulse RFc2 is applied as a RF intermediate pulse at an arbitrary position on the FSE sequence after application of the flip pulse RFI1. FIG. 4 shows an example that the $\alpha 2°$ frequency-selective fat saturation pulse RFc2 is applied between the first refocus pulse RFI2 and the second refocus pulse RFI3. However, the $\alpha 2°$ frequency-selective fat saturation pulse RFc2 may be applied after application of an arbitrary refocus pulse.

Note that, the $\alpha 2°$ frequency-selective fat saturation pulse RFc2 may be applied between the flip pulse RFI1 and the first refocus pulse RFI2. However, the interval between the refocus pulses is longer than the interval between the flip pulse RFI1 and the first refocus pulse RFI2. Therefore, when the frequency-selective fat saturation pulse RFc2 is applied between the refocus pulses, it is highly possible that the pulse length of the frequency-selective fat saturation pulse RFc2 can be set to a desired length. Therefore, it is preferable to apply the frequency-selective fat saturation pulse RFc2 between the refocus pulses to obtain a desired contrast easily.

In addition, it is preferable to determine the FA of the fat saturation pulse RFc2 so that the contrast control effect can be constantly maintained according to the FA of the refocus pulses RFI2, RFI3, RFI4, . . . . For example, if the FA of the refocus pulses RFI2, RFI3, RFI4, . . . is $180°$, it is preferable to set the FA of the fat saturation pulse RFc2 to $\alpha 2°=180°$. In this case, since a magnetization in a fat region inverts by $180°$ with respect to a magnetization in a region other than fat by application of the fat saturation pulse RFc2, the suppressed magnetization state in the fat region is constantly maintained even though the $180°$ refocus pulse is applied repeatedly.

For example, an adiabatic pulse can be used for the $\alpha 2°$ frequency-selective fat saturation pulse RFc2 as well as the $\alpha 1°$ frequency-selective fat saturation pulse RFc1.

Thus, the $\alpha 1°$ frequency-selective fat saturation pulse RFc1 functions as the first fat saturation pulse and the $\alpha 2°$ frequency-selective fat saturation pulse RFc2 functions as the second fat saturation pulse.

Meanwhile, a slice selection gradient magnetic field pulse Gss1 corresponding to the flip pulse RFI1, and slice selection gradient magnetic field pulses Gss2, Gss3, Gss4, . . . respectively corresponding to the refocus pulses RFI2, RFI3, RFI4, . . . , are applied. The slice selection gradient magnetic field pulse Gss1 corresponding to the flip pulse RFI1 has a dephasing part. Each of the slice selection gradient magnetic field pulses Gss2, Gss3, Gss4, . . . respectively corresponding to the refocus pulses RFI2, RFI3, RFI4, . . . , has a spoiler gradient magnetic field parts on its both sides.

Further, a readout gradient magnetic field pulse (Gro3, . . . in the case of FIG. 4) having the same area S is applied following each of the refocus pulses (RFI3, RFI4, . . . in the case of FIG. 4) except for a refocus pulse applied just before application of the $\alpha 2°$ fat saturation pulse RFc2. In addition, a readout gradient magnetic field pulse Gro1 for dephasing is applied following the flip pulse RFI1. The area of the readout gradient magnetic field pulse Gro1 for dephasing is S/2 which is half of each area S of the readout gradient magnetic field pulses (Gro3 . . . in the case of FIG. 4) applied subsequent to the refocus pulses (RFI3, RFI4, . . . in the case of FIG. 4).

Further, an arbitrary number of readout gradient magnetic field pulses are applied between the refocus pulse (RFI2 in the case of FIG. 4) applied just before application of the $\alpha 2°$ fat saturation pulse RFc2 and the refocus pulse (RFI3 in the case of FIG. 4) applied just after application of the $\alpha 2°$ fat saturation pulse RFc2. FIG. 4 shows an example in which two readout gradient magnetic field pulses Gsp2 and Gsp3 are applied before and after the $\alpha 2°$ fat saturation pulse RFc2. The total area of an arbitrary number of readout gradient magnetic field pulses (Gsp2 and Gsp3 in the case of FIG. 4) applied before and after the $\alpha 2°$ fat saturation pulse RFc2 is set to be the same as each area S of the readout gradient magnetic field pulses (Gro3, . . . in the case of FIG. 4) applied subsequent to other refocus pulses (RFI3, RFI4, . . . in the case of FIG. 4). Therefore, as shown in FIG. 4, when the area of the readout gradient magnetic field pulse Gsp2 applied before the $\alpha 2°$ fat saturation pulse RFc2 is S1, the area of the readout gradient magnetic field pulse Gsp3 applied after the $\alpha 2°$ fat saturation pulse RFc2 becomes S-S1.

That is, to avoid applying a readout gradient magnetic field pulse at the timing of application of the $\alpha 2°$ fat saturation pulse RFc2, it can be thought that the readout gradient magnetic field pulse that should be originally applied in the interval between the refocus pulses RFI2 and RFI3 where the $\alpha 2°$ fat saturation pulse RFc2 is applied is divided with the constant area to be set before and after the $\alpha 2°$ fat saturation pulse RFc2. By doing so, the readout gradient magnetic field pulse Gsp3 applied after the $\alpha 2°$ fat saturation pulse RFc2 can function as a spoiler gradient magnetic field pulse corresponding to the $\alpha 2°$ fat saturation pulse RFc2 by simply adjusting an imaging condition. Therefore, it is preferable to determine the area S-S1 of the readout gradient magnetic field pulse Gsp3 applied after the $\alpha 2°$ fat saturation pulse RFc2 so as to function adequately as a spoiler gradient magnetic field pulse.

However, since the area of the readout gradient magnetic field pulse Gsp3 applied after the $\alpha 2°$ fat saturation pulse RFc2 has an upper limit, a sufficient area might not be acquired. Accordingly, a spoiler gradient magnetic field pulse having an arbitrary area can be set in either a slice selection gradient magnetic field direction or a phase encode gradient magnetic field direction, or in both the directions. This allows setting an intensity of a spoiler gradient magnetic field pulse arbitrarily. In this case, if a pre-spoiler gradient magnetic field pulse having the same area as that of the spoiler gradient magnetic field pulse and the polarity opposite to that of the spoiler gradient magnetic field pulse is applied in application axial directions of the spoiler gradient magnetic field pulse before the α2° fat saturation pulse RFc2, a dephasing amount by the spoiler gradient magnetic field pulse can be cancelled so that echo signals from metabolites to be observed can be successfully acquired.

Note that, when a spoiler gradient magnetic field pulse is set in a slice selection gradient magnetic field direction or a phase encode gradient magnetic field direction, a readout gradient magnetic field pulse Gsp2 having the area S may be applied only before the α2° fat saturation pulse RFc2 with setting the area S-S1 of the readout gradient magnetic field pulse Gsp3, applied as a spoiler gradient magnetic field pulse after the α2° fat saturation pulse RFc2, to zero. Meanwhile, a readout gradient magnetic field pulse Gsp3 having the area S may be applied only after the α2° fat saturation pulse RFc2 without applying the readout gradient magnetic field pulse Gsp2 before the α2° fat saturation pulse RFc2 whether a spoiler gradient magnetic field pulse is applied in a direction other than the readout gradient magnetic field direction or not. That is, the readout gradient magnetic field pulse that should be applied in the interval between the refocus pulses RFI2 and RFI3 where the α2° fat saturation pulse RFc2 is applied may not be necessarily divided.

Moreover, phase encode gradient magnetic field pulses Gpe3, Gpe4, ... having opposite signs and a equal area are applied in the intervals among respective applications of the refocus pulses RFI2, RFI3, RFI4, .... However, it is also possible to remove the phase encode gradient magnetic field pulses applied in the interval between the refocus pulses RFI2 and RFI3 where the α2° fat saturation pulse RFc2 is applied, and to set the foregoing pre-spoiler gradient magnetic field pulse and the foregoing spoiler gradient magnetic field pulse.

FIG. 4 shows an example that the pre-spoiler gradient magnetic field pulse Gsp4 and the spoiler gradient magnetic field pulse Gsp5 that have the same area and mutually opposite polarities are set in the phase encode gradient magnetic field direction before and after the α2° fat saturation pulse RFc2. Then, unnecessary signal component from fat is suppressed by application of the spoiler gradient magnetic field pulse Gsp5 while a dephasing amount by the spoiler gradient magnetic field pulse Gsp5 can be cancelled by application of the pre-spoiler gradient magnetic field pulse Gsp4. Consequently, NMR signals from a desired metabolite to be observed other than fat can be successfully extracted. Note that, a pre-spoiler gradient magnetic field pulse and a spoiler gradient magnetic field pulse may be applied in the slice selection gradient magnetic field direction as described above.

In the foregoing pulse sequence, echo signals are generated by application of the readout gradient magnetic field pulse Gro3, ... during the intervals among the refocus pulses RFI3, RFI4, ... where the α2° fat saturation pulse RFc2 is not applied.

Meanwhile, not only a FSE sequence but an arbitrary pulse sequence based on another imaging technique can be used as an imaging sequence. That is, application of a RF intermediate pulse can be set after application of a RF excitation pulse such as a flip pulse, a flop pulse or a refocus pulse. In addition, application of a RF pre-pulse can be set before application of a flip pulse or a flop pulse as needed.

In this case, gradient magnetic field pulses must be determined so that no gradient magnetic field pulse is applied at a timing of application of the RF intermediate pulse, and a gradient magnetic field pulse such as a readout gradient magnetic field pulse applied just after the RF intermediate pulse can be used as a spoiler gradient magnetic field pulse. Meanwhile, when a pulse available as a spoiler gradient magnetic field pulse does not exist after the RF intermediate pulse, a spoiler gradient magnetic field pulse and a pre-spoiler gradient magnetic field pulse can be set before and after the RF intermediate pulse in an arbitrary axis direction or a plurality of arbitrary axis directions of the readout gradient magnetic field direction, the phase encode gradient magnetic field direction and the slice selection gradient magnetic field direction.

Then, data can be more successfully acquired with suppressing signals from an unnecessary metabolite such as fat to control the contrast by application of a readout gradient magnetic field pulse after the RF intermediate pulse.

Figure 5:
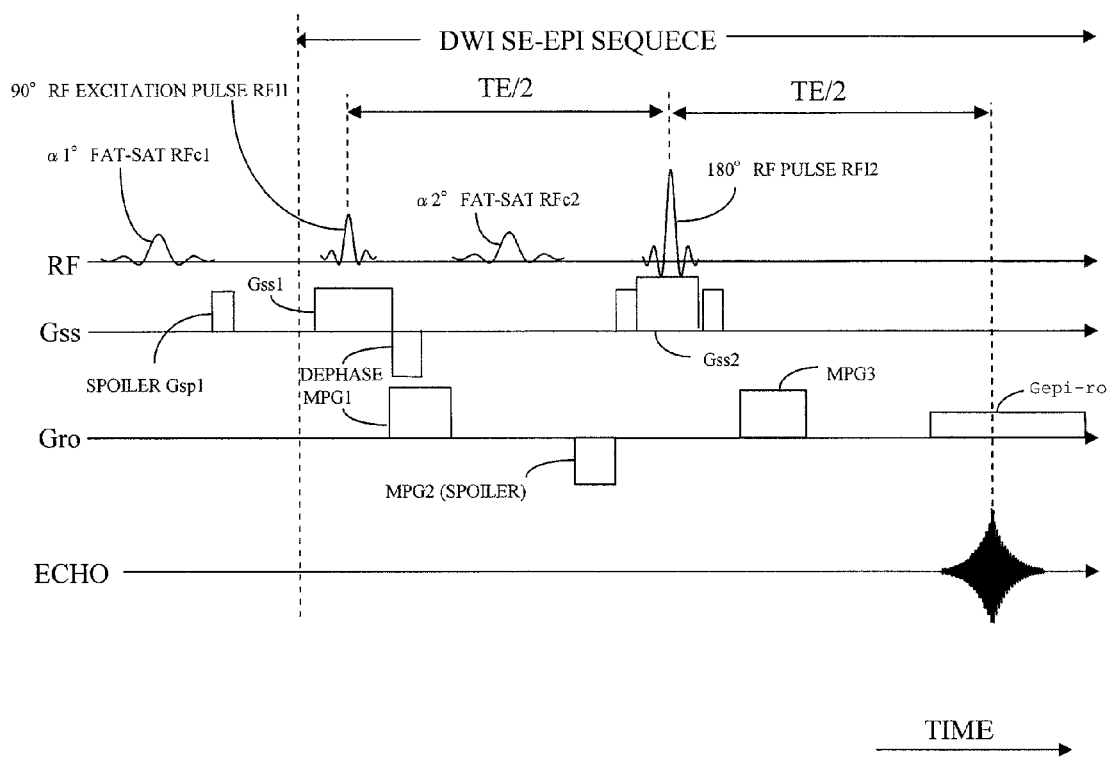
FIG. 5 is a time chart showing an example of DWI (diffusion weighted imaging) sequence, with applying two fat-saturation pulses as a RF pre-pulse and a RF intermediate pulse, which is set by the imaging condition setting unit shown in FIG. 3.

FIG. 5 is a time chart showing an example of DWI (diffusion weighted imaging) sequence, with applying two fat-saturation pulses as a RF pre-pulse and a RF intermediate pulse, which is set by the imaging condition setting unit 40 as shown in FIG. 3.

In FIG. 5, RF denotes RF pulses while Gss and Gro denote axes to which gradient magnetic field for slice selection and gradient magnetic field for readout are respectively applied. ECHO denotes echo signals. Note that, explanations of gradient magnetic field for phase encode and each pulse similarly to a pulse shown in FIG. 4 are omitted.

As shown in FIG. 5, an α1° frequency-selective fat saturation pulse RFc1 is applied as a RF pre-pulse prior to a DWI sequence for imaging.

For example, the DWI sequence is a sequence derived by adding a MPG (motion probing gradient) pulse to a SE-EPI sequence based on the SE (Spin Echo) method and the EPI (echo planar imaging) method. That is, a 180° RF pulse RFI2 is applied after TE/2 following application of a 90° RF excitation pulse RFI1. In addition, slice selection gradient magnetic field pulses Gss1 and Gss2 are applied together respectively with the 90° RF excitation pulse RFI1 and the 180° RF pulse RFI2. Then, echo signals can be acquired continuously after a TE from application of the 90° RF excitation pulse RFI1 by applications of readout gradient magnetic field pulses Gepi-ro set based on the EPI method.

Moreover, an arbitrary number of MPG pulses are applied in arbitrary gradient magnetic field directions arbitrarily set depending on an imaging purpose. For example as shown in FIG. 5, the first positive MPG pulse MPG1 and the second negative MPG pulse MPG2 are applied in the readout gradient magnetic field direction between the 90° RF excitation pulse RFI1 and the 180° RF pulse RFI2, and the third positive MPG pulse MPG3 is applied in the readout gradient magnetic field direction between the 180° RF pulse RFI2 and the readout gradient magnetic field pulses Gepi-ro based on the EPI method.

Moreover, an α2° frequency-selective fat saturation pulse RFc2 can be applied as a RF intermediate pulse at an arbitrary position on the DWI sequence after application of the 90° RF excitation pulse RFI1. For example as shown in FIG. 5, if the α2° frequency-selective fat saturation pulse RFc2 is applied between the first positive MPG pulse MPG1 and the second negative MPG pulse MPG2, the second negative MPG pulse MPG2 can be used as a spoiler gradient magnetic field pulse.

In addition, if the α2° frequency-selective fat saturation pulse RFc2 is applied before acquisition of the first echo signal for imaging, the effect of the α2° frequency-selective fat saturation pulse RFc2 can be provided to all echo signals.

Further, even when a MPG pulse is not set in an appropriate position in the DWI sequence before having set the α2° fat saturation pulse RFc2, a MPG pulse can be intentionally set so as to be used as a spoiler gradient magnetic field pulse in an appropriate position after the α2° fat saturation pulse RFc2 by keeping a total area of all MPG pulses constant. Moreover, a pair of a pre-spoiler gradient magnetic field pulse and a spoiler gradient magnetic field pulse can be set in arbitrary axis directions, e.g., axes where no MPG pulse is applied.

In addition, when the α2° fat saturation pulse RFc2 is applied between the 180° RF pulse RFI2 and the readout gradient magnetic field pulses Gepi-ro based on the EPI method, echo signals acquired by applications of the readout gradient magnetic field pulses Gepi-ro can also achieve the fat suppression effect by the α2° fat saturation pulse RFc2. In this case, the third MPG pulse MPG3 can be used as a spoiler gradient magnetic field pulse.

Now, other functions of the computer 32 will be described.

The sequence controller control unit 41 has a function for controlling the driving of the sequence controller 31 by giving the imaging condition including the pulse sequence, acquired from the imaging condition setting unit 40, to the sequence controller 31 based on information from the input device 33 or another element. In addition, the sequence controller control unit 41 has a function for receiving raw data from the sequence controller 31 and arranging the raw data to k space formed in the k-space database 42. Therefore, the k-space database 42 stores the raw data generated by the receiver 30 as k space data.

The image reconstruction unit 43 has a function for reconstructing image data by obtaining the k-space data from the k-space database 42 and performing image reconstruction processing including FT (Fourier transform) of the k-space data and a function for writing the generated image data to the image database 44. Therefore, the image database 44 stores the image data reconstructed by the image reconstruction unit 43.

The image processing unit 45 has a function for generating two-dimensional image data for display by performing necessary image processing to the image data read form the image database 44 and displaying the generated image data on the display unit 34. (Operation and action)

Now, the operation and action of a magnetic resonance imaging apparatus 20 will be described.

Figure 6:
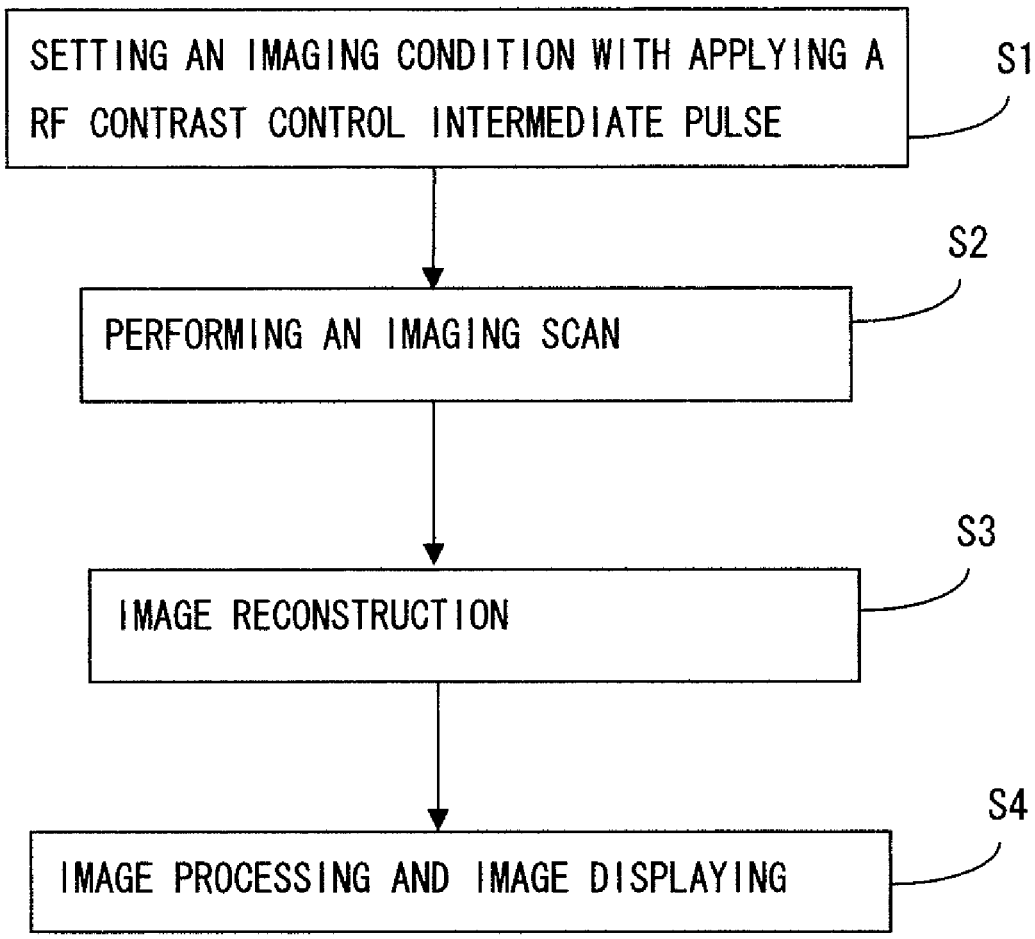
FIG. 6 is a flowchart showing a procedure for acquiring an image of the object by imaging with applying a RF intermediate pulse with the magnetic resonance imaging apparatus shown in FIG. 2.

FIG. 6 is a flowchart showing a procedure for acquiring an image of the object P through imaging by applying a RF intermediate pulse with the magnetic resonance imaging apparatus 20 as shown in FIG. 2. The reference numerals each including a character S with a number in FIG. 6 indicate respective steps of the process.

In step S1, an imaging condition including a pulse sequence, as shown in FIG. 4 or FIG. 5, with applying a RF intermediate pulse for controlling a contrast is set in the image condition setting unit 40 based on information input from the input device 33. In addition, a RF pre-pulse is added as needed.

Subsequently, in step S2, an imaging scan is performed according to the set imaging condition for data acquisition For that purpose, the object P is placed on the bed 37, and a static magnetic field is generated at an imaging area of the magnet 21 (a superconducting magnet) for static magnetic field as excited by the static-magnetic-field power supply 26. Further, the shim-coil power supply 28 supplies current to the shim coil 22, thereby uniformizing the static magnetic field generated at the imaging area.

The input device 33 sends instructions for starting an imaging scan to the sequence controller control unit 41. The sequence controller control unit 41 supplies a pulse sequence by applying a RF intermediate pulse, received from the imaging condition setting unit 40, to the sequence controller 31. Therefore, the sequence controller 31 drives the gradient power supply 27, the transmitter 29, and the receiver 30 in accordance with the pulse sequence received from the sequence controller control unit 41, thereby generating a gradient magnetic field at an imaging area having the set object P, and further generating RF signals from the RF coil 24.

Consequently, the RF coil 24 receives NMR signals generated due to nuclear magnetic resonance in the object P. Then, the receiver 30 receives the NMR signals from the RF coil 24 and generates raw data which is digital data of the NMR signals by A/D conversion subsequent to some necessary signal processing. The receiver 30 supplies the generated raw data to the sequence controller 31. The sequence controller 31 supplies the raw data to the sequence controller control unit 41. The sequence controller control unit 41 arranges the raw data as k-space data to the k space formed in the k-space database 42.

Subsequently, in step S3, the image reconstruction unit 43 reads the k-space data from the k-space database 42 and performs image reconstruction processing including Fourier transform to the read k-space data, thereby reconstructing image data. The generated image data is written into the image database 44.

Subsequently, in step S4, the image processing unit 45 reads the image data form the image database 44 and performs necessary image processing of the image data, thereby generating two-dimensional image data for displaying. The generated display image data is displayed on the display unit 34. Since the image data is acquired according to an imaging condition by applying a RF intermediate pulse as shown in FIG. 4 or FIG. 5, for controlling the contrast, the image data can be acquired in a less imaging time. Moreover, if a RF pre-pulse for controlling the contrast is applied, a more satisfactory fat suppression effect can be achieved in the image data.

That is, the foregoing magnetic resonance imaging apparatus 20 is an apparatus which acquires image data by applying a RF intermediate pulse, such as a fat saturation pulse, for controlling a contrast and a spoiler gradient magnetic field pulse during execution of an imaging sequence.

Consequently, according to the foregoing magnetic resonance imaging apparatus 20, the first TR can be shortened since a RF pre-pulse is not necessarily required. Especially in the case of a multi slice imaging, the minimum TR for performing imaging a specific slice set can be shortened. For this reason, the number of slices can be increased in multi slice imaging with performing a contrast control such as fat suppression.

Moreover, if the same kind of contrast control pulse such as a RF intermediate pulse is applied as a RF pre-pulse in the magnetic resonance imaging apparatus 20, more satisfactory contrast control can be performed. For example, if fat saturation pulses are applied as a RF pre-pulse and a RF intermediate pulse, an adequate fat suppression effect can be achieved. Meanwhile, if a different kind of contrast control pulse from that of a RF intermediate pulse is applied as a RF pre-pulse, various image contrast controls can be performed depending on an imaging purpose.

Since a chemical shift amount increases especially in a high magnetic field apparatus exceeding 3T, improvement of an image contrast can be expected by application of the foregoing RF intermediate pulse.

Note that, multichannelizing of a RF transmission pulse that transmits a RF transmission pulse formed by using multiple RF element coils has been designed. For that reason, if a RF pre-pulse and/or a RF intermediate pulse are transmitted by using multiple RF element coils, profiles of the RF pre-pulse and/or the RF intermediate pulse in a frequency direction can be stabilized. Consequently, a more satisfactory contrast control can be performed.

What is claimed is:

1. A magnetic resonance imaging apparatus comprising:
a data acquisition unit configured to perform an imaging scan based on a Fast Spin Echo sequence, the imaging scan including
applying at least one radio frequency excitation pulse for acquiring magnetic resonance signals;
applying a plurality of refocus pulses after each of the radio frequency excitation pulses;
for controlling a contrast, applying one or more frequency-selective or slice-selective radio frequency intermediate pulses, wherein each of the one or more radio frequency intermediate pulses is separately applied between at least one respective pair of successive refocus pulses, and the one or more frequency-selective radio frequency intermediate pulses are radio frequency pulses applied to a matter having a resonance frequency different from that of NMR signals acquired for imaging and the one or more slice-selective radio frequency intermediate pulses are radio frequency pulses applied in a slice different from an imaging slice;
for suppressing a signal component, applying a spoiler gradient magnetic pulse subsequent to each of the radio frequency intermediate pulses; and
acquiring magnetic resonance signals for imaging; and
an image data generating unit configured to generate image data based on the magnetic resonance signals.

2. A magnetic resonance imaging apparatus of claim 1, wherein the one or more radio frequency intermediate pulses include a fat saturation pulse.

3. A magnetic resonance imaging apparatus of claim 1, wherein the one or more radio frequency intermediate pulses include at least one of a water selective excitation pulse, a saturation pulse for suppressing signals from a respective matter, a spin labeling pulse, a magnetization transfer contrast pulse for suppressing signals from by saturating a magnetization of protons in bound water and a slice-selective off-resonance sinc pulse, which is a magnetization transfer contrast pulse applied with a slice selection gradient magnetic field.

4. A magnetic resonance imaging apparatus of claim 1, wherein said data acquisition unit is configured to apply, precedently to the radio frequency excitation pulses and for controlling the contrast, a frequency-selective radio frequency pre-pulse, which is applied to a matter having a resonance frequency different from that of NMR signals acquired for imaging, or a slice-selective radio frequency pre-pulse, which is applied in a slice different from an imaging slice, followed by a spoiler gradient magnetic field.

5. A magnetic resonance imaging apparatus of claim 1, wherein the one or more radio frequency intermediate pulses are of the same type.

6. A magnetic resonance imaging apparatus of claim 1, wherein the one or more radio frequency intermediate pulses are of different types.

7. A magnetic resonance imaging apparatus of claim 1, wherein each of the spoiler gradient magnetic fields is applied in a predetermined readout direction.

8. A magnetic resonance imaging apparatus of claim 1, wherein said data acquisition unit is configured to apply each of spoiler gradient magnetic fields in at least one of a slice direction and a phase encode direction and to apply a gradient magnetic field for cancelling a dephasing amount by the spoiler gradient magnetic field, the gradient magnetic field for cancelling the dephasing amount being applied precedently to the respective radio frequency intermediate pulse.

9. A magnetic resonance imaging apparatus of claim 1, wherein said data acquisition unit is configured to determine a flip angle of each of the radio frequency intermediate pulses depending on the flip angle of the refocus pulses.

10. A magnetic resonance imaging apparatus of claim 1, wherein said data acquisition unit is configured to transmit the one or more radio frequency intermediate pulses with plural element coils.

11. A magnetic resonance imaging apparatus of claim 1, wherein said data acquisition unit is configured to apply the one or more radio frequency intermediate pulses at a timing according to at least one of an echo interval and an echo time.

12. A magnetic resonance imaging apparatus of claim 1, where a plurality of readout gradient magnetic field pulses are applied before and after predetermined ones of the radio frequency intermediate pulses.

13. A magnetic resonance imaging apparatus of claim 12, where a predetermined set of the readout gradient magnetic field pulses has a predetermined total amount of time.

14. A magnetic resonance imaging apparatus of claim 13, where among the predetermined set of the readout gradient magnetic field pulses, the readout gradient magnetic field pulses applied after the predetermined ones of the radio frequency intermediate pulses are the spoiler gradient magnetic filed pulses.

15. A magnetic resonance imaging method comprising:
performing an imaging scan on a Fast Spin Echo sequence, the imaging scan including
applying at least one radio frequency excitation pulse for acquiring magnetic resonance signals;
applying a plurality of refocus pulses after each radio frequency excitation pulse;
for controlling contrast, applying one or more frequency-selective or slice-selective radio frequency intermediate pulses, wherein each of the one or more radio frequency intermediate pulses is separately applied between a respective pair of successive refocus pulses, and the one or more frequency-selective radio frequency intermediate pulses are radio frequency pulses applied to a matter having a resonance frequency different from that of NMR signals acquired for imaging and the one or more slice-selective radio frequency intermediate pulses are radio frequency pulses applied in a slice different from an imaging slice;
for suppressing a signal component, applying a spoiler gradient magnetic field subsequent to each of the radio frequency intermediate pulses; and
acquiring magnetic resonance signals for imaging; and
generating image data based on the magnetic resonance signals.

* * * * *